(12) United States Patent
Takeuchi

(10) Patent No.: US 7,125,735 B2
(45) Date of Patent: Oct. 24, 2006

(54) METHOD OF FABRICATING SEMICONDUCTOR DEVICE

(75) Inventor: Tatsuya Takeuchi, Yamanashi (JP)

(73) Assignee: Eudyna Devices, Inc., Yamanashi (JP)

( * ) Notice: Subject to any disclaimer, the term of this patent is extended or adjusted under 35 U.S.C. 154(b) by 0 days.

(21) Appl. No.: 11/052,114

(22) Filed: Feb. 8, 2005

(65) Prior Publication Data

US 2006/0177953 A1    Aug. 10, 2006

(30) Foreign Application Priority Data

Feb. 9, 2004    (JP)    ............................... 2004-032753

(51) Int. Cl.
*H01L 21/00*    (2006.01)
(52) U.S. Cl. ................. 438/41; 257/E21.097
(58) Field of Classification Search .................. 438/29, 438/31, 32, 35, 39, 41, 42, 44, 45, 46, 47, 438/77, FOR. 256, FOR. 264, FOR. 267, 438/22; 257/11, 189, 604, 615, E33.002, 257/E33.013, E33.025, E21.085, E21.117, 257/E21.172, E21.213, E21.097
See application file for complete search history.

(56) References Cited

U.S. PATENT DOCUMENTS 5,783,844 A * 7/1998 Kobayashi et al. ......... 257/103
6,030,452 A * 2/2000 Takeuchi ..................... 117/104
2002/0119661 A1* 8/2002 Watanabe et al. ........... 438/691

FOREIGN PATENT DOCUMENTS

| JP | 01-101624 | 4/1989 |
|---|---|---|
| JP | 08-97509 | 4/1996 |
| JP | 2002-198616 | 7/2002 |

OTHER PUBLICATIONS

T. Takeuchi et al.; "Comparison of chlorocarbons as an additive during MOVPE for flat burying growth of InP" Journal of Crystal Growth, (1997), pp. 611-615, vol. 174. Elsevier.

* cited by examiner

*Primary Examiner*—Brooke Kebede
(74) *Attorney, Agent, or Firm*—Westerman, Hattori, Daniels & Adrian, LLP.

(57) ABSTRACT

A method of fabricating a semiconductor device includes the steps of forming a step region having a mesa shape in a direction of <011> or <0-11> on a (100) plane of an InP-based compound semiconductor crystal, and burying the step region with InP-based buried layers grown by vapor-phase growth by supplying a base gas to which a chlorinated organic compound is added, the organic chlorine compound including at least two carbon atoms, and each of the carbon atoms is bonded to one chlorine (Cl) atom in one molecule. The chlorinated organic compound is any one of 1,2-dichloroethane, 1,2-dichloropropane, and 1,2-dichloroethylene.

12 Claims, 11 Drawing Sheets

[0 1 1]

3 μm

3 μm

3 μm

3 μm

6 μm

6 μm

3 μm

[0-1 1]

METHOD OF FABRICATING SEMICONDUCTOR DEVICE

BACKGROUND OF THE INVENTION

1. Field of the Invention

This invention generally relates to a method for fabricating a semiconductor device, and more particularly, to a method for fabricating a semiconductor device such as a laser diode or the like having a step region of a mesa shape formed on a semiconductor substrate. With the fabricating method, the step region can be planarized with highly crystalline buried layers.

2. Description of the Related Art

In recent years, the optical communication techniques with the use of the laser diodes and optical fibers have achieved a remarkable breakthrough. In each home, a broadband communication is available at a low cost. With the increase of the communication traffic on a personal basis in the days to come, FTTH (Fiber To The Home) is expected to be the main stream instead of ADSL in the near future. This highly advanced optical communication techniques are requesting technical advantages and price reduction of optical semiconductor devices such as the laser diode.

FIG. 1 illustrates a structure of a low cost laser diode conventionally used for the optical communication, and is a cross-sectional view of the laser diode seen from the direction of [011]. This is disclosed in, for example, Japanese Patent Application Publication No. 2002-198616 (hereinafter referred to as Document 1). A laser diode 10 includes an n-type (100) InP substrate 11 having an n-side electrode 17 on the backside thereof. An n-type InGaAsP layer, an InGaAsP layer, a p-type InP layer, and a p-type InGaAs layer are sequentially deposited on a main plane of the n-type InP substrate 11. A step region having a post shape or mesa shape is formed by dry etching to leave a part of the laminated structure. Each layer of the step region includes an n-type InGaAsP guide layer 12, an InGaAsP-MQW active layer 13, a p-type InP clad layer 14, and a p-type InGaAs contact layer 15. On both sides of the step region, an Fe-doped highly resistant buried layers 16 are buried and planarized. The Fe-doped highly resistant buried layers 16 have been grown by metal organic chemical vapor deposition (MOCVD) with a mixed gas in which chloromethane ($CH_3Cl$) is added to a base gas. An $SiO_2$ protective coating 19 is provided with an opening to expose the whole plane of the p-type InGaAs contact layer 15 and a part of the Fe-doped highly resistant buried layers 16, which are adjacent to the Fe-doped highly resistant buried layers 16. Additionally, a p-side electrode 18 is provided for biasing the p-type InGaAs contact layer 15 in the opening of the $SiO_2$ protective coating 19.

The laser diode having the structure in FIG. 1 has only two crystal growth processes with the MOCVD method. The two crystal growth processes include a formation of the laminated structure and a formation of the buried layers. The fabricating process is relatively simple and easy. Dry etching as represented by RIE (Reactive Ion Etching) is superior to wet etching with the use of a liquid etchant, with respect to controllability and reproducibility. In addition, there is an advantage in that a large area can be etched uniformly. The MOCVD method is a crystal growth process that can grow the crystal uniformly on the substrate having a large hole diameter. In addition to the above-mentioned dry etching, the MOCVD method is suitable for mass production and cost reduction of the laser diodes. Further, after the growth of the buried layers, protrusions and dents generated on the plane are etched with a compound liquid including hydrochloric acid and acetic acid to completely planarize the vicinity of the step region (the vicinity of the mesa). With the above-mentioned planarization technique, a high process yield is obtainable in the electrode formation process and thus the cost reduction becomes possible.

In order to remove the protrusions and dents generated on the plane after the growth of the buried layers and planarization of the plane, with the above-mentioned technique, it is necessary to perform the crystal growth on the buried layers to be thick in advance so that the planes of the buried layers may be higher than that of the step region. The above-mentioned crystal growth of the buried layers might increase the costs of raw materials and maintenance fees required for the crystal growth and might decrease the throughput in the production process. This will result in an increase of the production cost of the laser diode. For instance, in the case where a step region having a height of 3.0 μm is buried by buried layers having a crystal growth rate of 2.0 μm/h, it originally takes 1.5 hours for the crystal growth. However, it actually takes 1.8 hours to make the crystal grow thicker. Therefore, it is desirable that the plane state of the buried layers buried on both sides of the step region is made plane just after the crystal growth in order to eliminate the removal process of the protrusions and dents.

Conventionally, in the case where the InP step region is buried for planarization by a high-resistant InP layer, only a mixed gas of TMI (Trimethylindium) gas, a material of In and $PH_3$ (phosphine), a material of P is supplied for the crystal growth. The InP step region extends in stripes in the direction of <0-11> on a substrate having a crystal face orientation of zincblende crystal structure (100) (for example, the InP substrate), and the crystal of the high-resistant InP layer has been grown with the MOCVD method.

Japanese Patent Application Publication No. 1-101624 (hereinafter referred to as Document 2) describes that the crystal growth is suppressed on a (111) plane of the side faces of the step region and the plane burying can be achieved, in the case where the extending direction of the step region is off at five or more degrees from the direction of <0-11>, although the crystal having the (111) plane as a facet plane is grown along the side faces of the step region with the protrusions and the plane burying cannot be achieved, in the case where the above-mentioned gas is supplied for burying the step region extending in the direction of <0-11>. Document 2 also describes that the protrusions of at least 1 μm are generated on the side faces of the step region and the flat plane is not obtainable in the case where the extending direction of the step region is deviated (off angle) from the direction of <0-11> at less than five degrees. With the above-mentioned background, it is impossible to bury the step region on a plane in the case where the step region has the off angle of less than five degrees from the direction of <0-11>, with respect to the conventional crystal growth technique that employs the mixed gas of the TMI gas and $PH_3$ gas only as a supplied gas.

In the case where the step region extends in the direction of <011>, it is well known that excellent buried layers are obtainable by performing the crystal growth after a chlorinated organic compound based gas is added to the base gas. Japanese Patent Application Publication No. 8-97509 (hereinafter referred to as Document 3) describes that carbon tetrachloride, monochloroethane, monochloromethane, hydrogen chloride, and trichloroethane are included in the above-mentioned chlorinated organic compound based gas.

According to the experimental results made by the inventors, the inventors find that it is hard to obtain the excellent buried layers, in the case where any one of the above-mentioned chlorinated organic compound based gases disclosed in Document 3 is added to bury the step region extending in the exact direction of <0-11>. The protrusions and dents are generated because of the crystal growth of the buried layers on an A plane (In plane) of the InP (111) plane in an upper edge of the step region, a defect was found on the laminated layer on the A plane.

As described, the conventional burying techniques have difficulties in that the step region extending in the direction of <0-11> cannot be buried on a plane. This limits the flexibility of a mesa stripe orientation that can be used for fabricating the devices.

SUMMARY OF THE INVENTION

It is a general object of the present invention to provide a method of fabricating semiconductor devices, with which a step region can be planarized, the step region being formed on the (100) plane of a compound semiconductor crystal having sidewalls in a desirable direction from directions of <011> to <0-11>, by high crystalline buried layers.

A more specific object of the present invention is to provide the method of fabricating the semiconductor devices, with which the step region having an off angle less than five degrees from the <0-11> direction can be planarized.

According to an aspect of the present invention, preferably, there is provided a method of fabricating a semiconductor device including the steps of, forming a step region having a mesa shape in a direction of <011> or <0-11> on a (100) plane of an InP-based compound semiconductor crystal, and burying the step region with InP-based buried layers grown by vapor-phase growth by supplying a base gas to which a chlorinated organic compound is added, the organic chlorine compound including at least two carbon atoms, and each of the carbon atoms is bonded to one chlorine atom in one molecule.

According to another aspect of the present invention, preferably, there is provided a method of fabricating a semiconductor device comprising the steps of, forming a step region having a mesa shape on a (100) plane of an InP-based compound semiconductor crystal in a substantially <0-11> direction, and supplying a base gas to which a chlorinated organic compound is added to bury the step region with InP-based buried layers grown by MOCVD. The step region is provided off from the substantially <0-11> direction by an angle of 2.5 to 6.5 degrees.

According to still another aspect of the present invention, preferably, there is provided a method of fabricating a semiconductor device comprising the steps of, forming a step region having a mesa shape in a direction of <011> or <0-11> on a (100) plane of an InP-based compound semiconductor crystal, and burying the step region with InP-based buried layers grown by vapor-phase growth by supplying a base gas to which a chlorinated organic compound is added, the organic chlorine compound including at least two carbon atoms, and each of the carbon atoms is bonded to one chlorine atom in one molecule, the buried layers covering a top plane of the step region, and etching the buried layers so as to have a height approximately equal to that of the step region.

In accordance with the present invention, there is provided a method of fabricating semiconductor devices, with which a step region can be planarized, the step region being formed on the (100) plane of a compound semiconductor crystal having sidewalls in a desirable direction from directions of <011> to <0-11>, by high crystalline buried layers. In particularly, with the above-mentioned method of fabricating the semiconductor devices, the step region having an off angle less than five degrees from the <0-11> direction can be planarized. This was considered impossible with the conventional techniques.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

The present invention has been made based on a first knowledge of the inventors, which is described as follows. With respect to the crystal growth of an InP-based buried layer such as InP, InGaP, and InGaAsP to be used for planarize the step region having a sidewall in a desirable direction from the direction of <0-11> to <011> provided on the (100) plane of the InP-based (InP, InGaP, and InGaAsP) compound semiconductor crystal, it will be possible to bury the step region having an excellent crystalline planarization, by adding to a base gas, any of 1,2-dichloroethane ($C_2H_4Cl_2$), 1,2-dichloropropane ($C_3H_6Cl_2$), and 1,2-dichloroethylene ($C_2H_2Cl_2$), which are the chlorinated organic compound gasses.

More specifically, the inventors conducted the experiments. Various chlorinated organic compound gasses were added to the base gas for the MOCVD growth in the InP buried layers in the step region provided on the (100) plane of the InP compound semiconductor crystal. The step region that had been formed by dry etching was filled. As a result, the inventors found that it was possible to bury the step region having the sidewall in the direction of <0-11> in an excellent crystalline planarization, by adding any of 1,2-dichloroethane, 1,2-dichloropropane, and 1,2-dichloroethylene to the base gas and making the buried layers grown by the MOCVD growth. Each of the above-mentioned chlorinated organic compounds includes two carbon (C) atoms, and each of the carbon atoms is bonded to one chlorine (Cl) atom in one molecule. Furthermore, the inventors found that the above-mentioned burying method for planarization is effective for the buried layers extending in a desirable direction from the direction of <0-11> to <011>.

Figure 1:
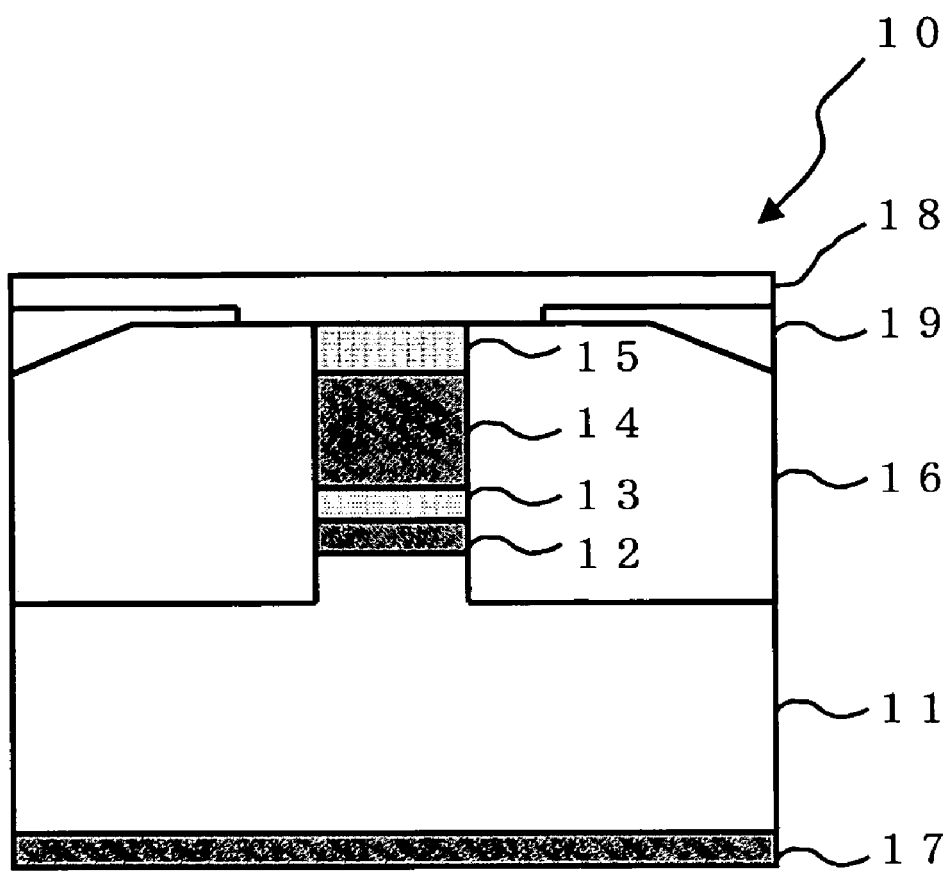
FIG. 1 illustrates a structure of a low cost laser diode conventionally used for the optical communication, and is a cross-sectional view of the laser diode seen from the direction of [011]
Figure 2A:
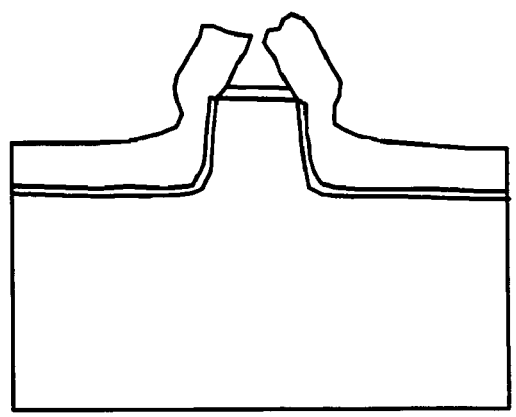
FIG. 2A shows a case where the buried layers are grown without a chlorinated organic compound gas added.
Figure 2B:
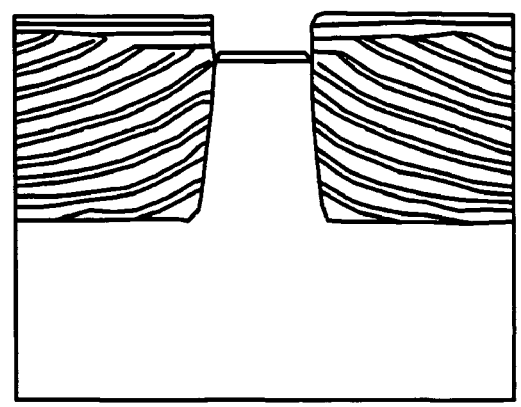
FIG. 2B shows another case where a $CH_3Cl$ gas is added.
Figure 2C:
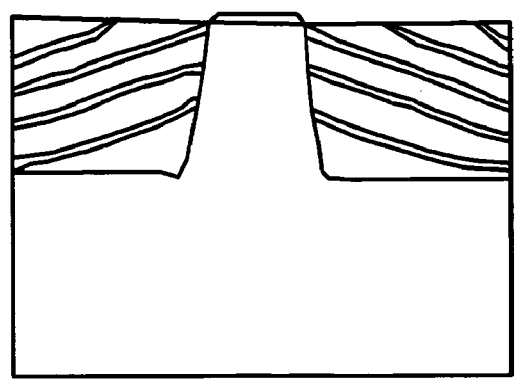
FIG. 2C shows still another case where 1,2-dichloroethane gas is added.
Figure 2C:

FIGS. 2A through 2C are cross-sectional SEM images illustrating planarization effects in the case where 1,2-dichloroethane gas is added to the base gas, with respect to the burying process of the step region by the InP buried layers. FIG. 2A shows a case where the buried layers are grown without chlorinated organic compound gas added. FIG. 2B shows another case where a $CH_3Cl$ gas is added. FIG. 2C shows still another case where 1,2-dichloroethane gas is added. In FIGS. 2A through 2C, striped contrasts shown in the buried layers are InGaAs marker layers inserted to show the progress in growth of the buried layers. In each SEM image, the step region extends in the direction of <0-11> in stripes, and the SEM observation direction corresponds to the direction of <0-11>, which is the extending direction of the step region.

Referring to FIG. 2A, in the case where the buried layers are grown without the chlorinated organic compound gas added, an InP (111) A plane (In plane) is generated on an upper end of the step region, as the crystal growth progresses on the sidewalls of the step region (of the mesa shape), and the crystal growth is developed on the (111) A plane. This results in a plane having a big difference between the surface of the top and that of the bottom in the step region. The crystal growth on the (111) A plane produces a defect in the layered structure and crystallization inevitably gets degraded.

Referring to FIG. 2B, in the case where a $CH_3Cl$ gas is added, the crystal growth is greatly suppressed both along the sidewalls of the step region and on the (111) A plane, as compared to the case where the buried layers are grown without the chlorinated organic compound gas added. However, the above-mentioned growth cannot be suppressed completely, and the planarization is not sufficient. The planarization can be improved by increasing the amount of $CH_3Cl$ added to the base gas. However, it is extremely hard to obtain the step region having a sufficiently planarized plane within an allowable amount of $CH_3Cl$, in the light of industrial production of the laser diode.

Referring to FIG. 2C, in contrast, in the case where 1,2-dichloroethane gas is added, the crystal growth is readily suppressed along the sidewall of the step region and on the (111) A plane, and it is possible to obtain a planarized shape of the step region, within an industrially practical amount. The above-mentioned growth can be suppressed completely, and the defect, which is produced together with the crystal growth, is not produced on the (111) A plane. The step region is buried with keeping the excellent crystallization. Moreover, the crystal growth rate (lateral growth) is high in growing from the sidewalls of the step region extending in stripes in the direction of <0-11> to a lateral direction. Thus, an excellent planarization is achieved.

The above-mentioned effects can be confirmed in any arbitrary extending direction of the step region from the direction of <0-11> to <011>. The shape of the step region is not necessarily in strips, and any desirable planarization shape such as a cylindrical or rectangular shape can be realized in the step region.

Figure 3A:
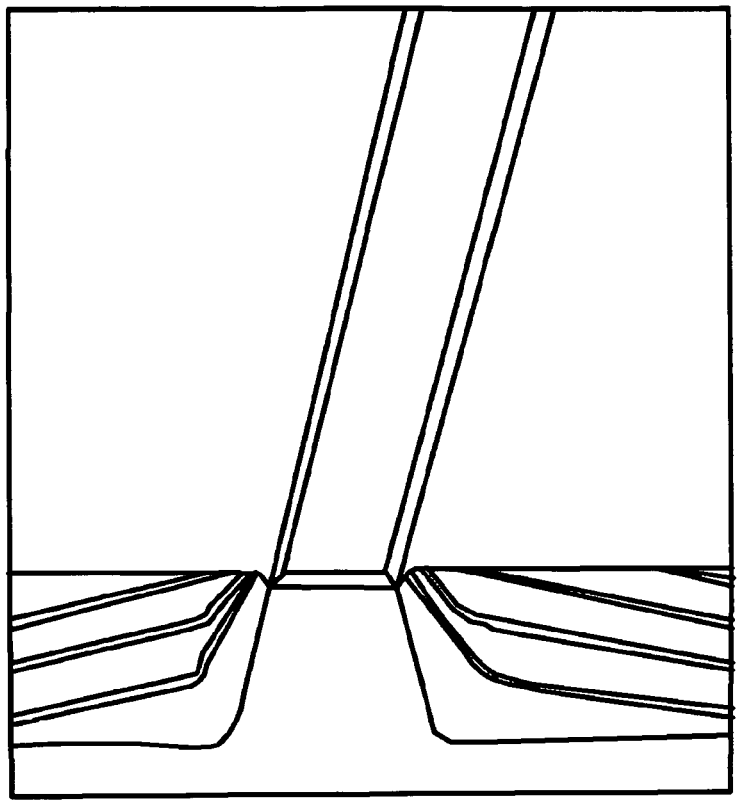
FIG. 3A shows a slanted SEM image.
Figure 3B:
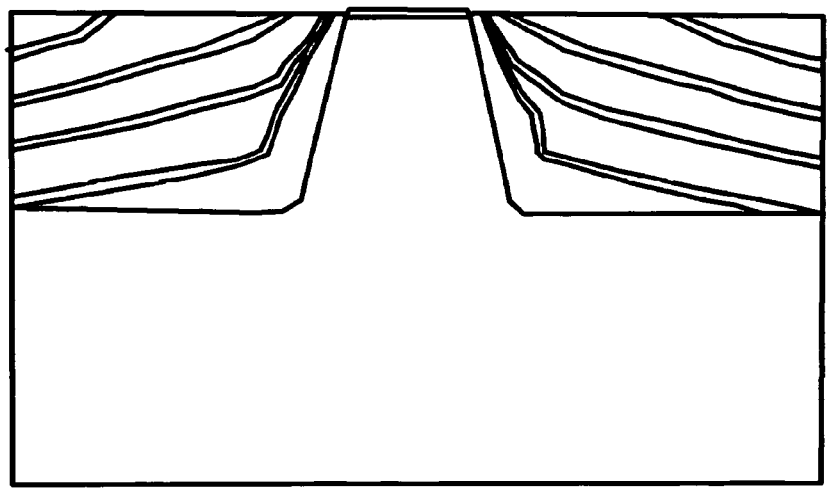
FIG. 3B shows a cross-sectional SEM image.

FIGS. 3A and 3B are SEM images illustrating planarization effects in the case where the extending direction is deviated by six degrees from the direction of <0-11> in the step region provided on the (100) plane of the InP compound semiconductor crystal. The burying procedure is conducted by burying InP high-resistance buried layers. A 1,2-dichloroethane gas is added to the base gas. FIG. 3A shows a slanted SEM image. FIG. 3B shows a cross-sectional SEM image. As shown in these SEM images, the step region is planarized by the InP high resistant buried layers buried on both sides thereof. As in FIGS. 2A through 2C, the marker layers are inserted into the buried layers. The above-mentioned planarization can be achieved in the case where 1,2-dichloropropane or 1,2-dichloroethylene is added.

Figure 4A:
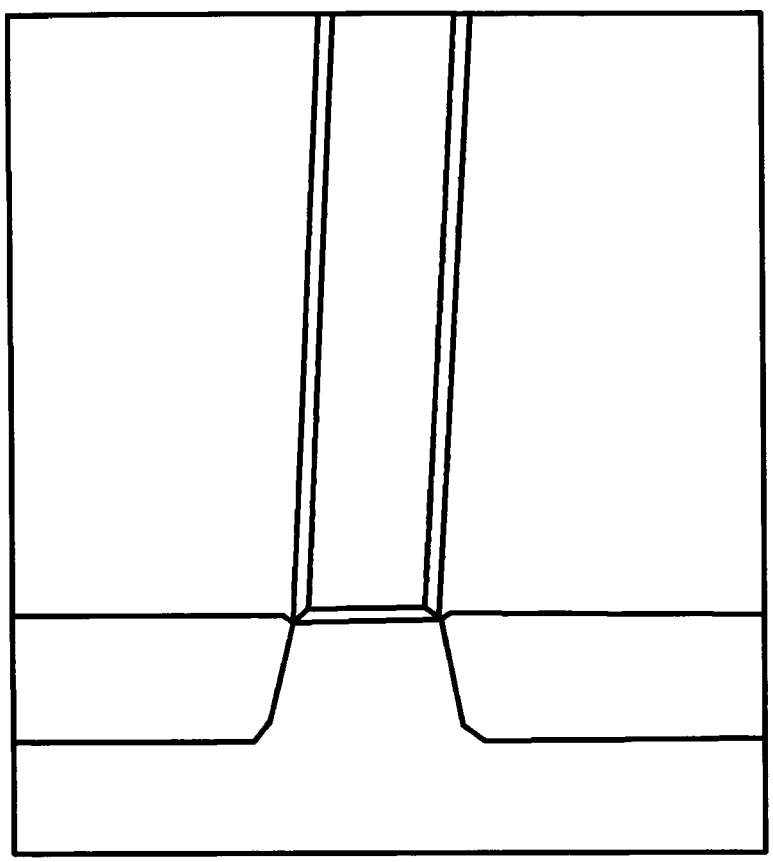
FIGS. 4A and 4B are SEM images illustrating planarization effects in the case where 1,2-dichloroethylene.
Figure 4B:
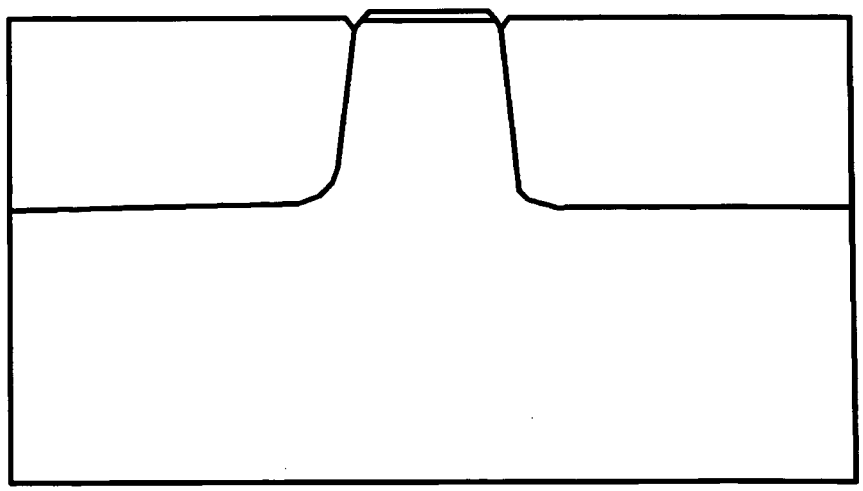
Figure 5A:
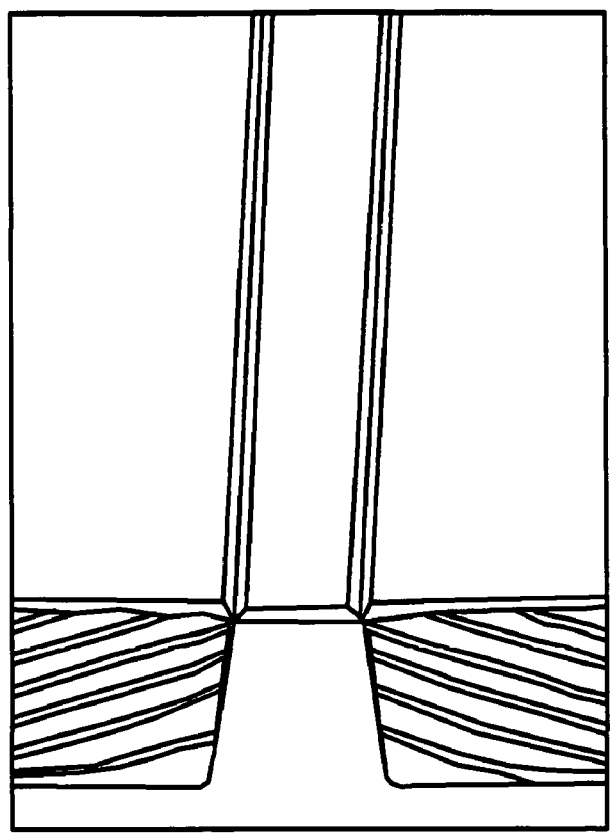
FIGS. 5A and 5B are the SEM images illustrating planarization effects in the case where 1,2-dichloropropane.
Figure 5B:
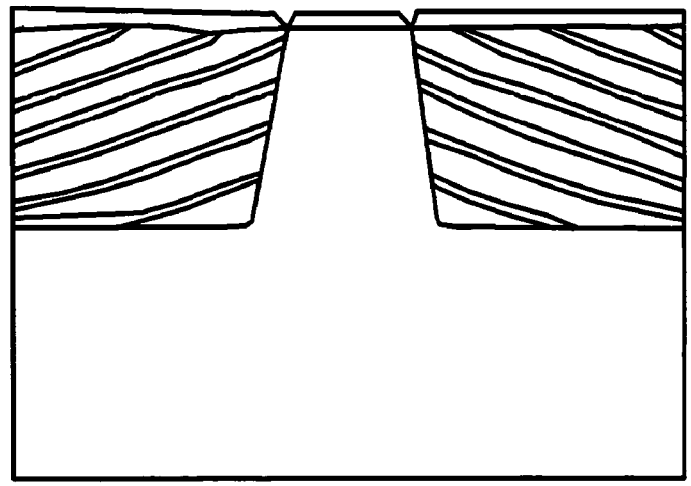

FIGS. 4A and 4B and FIGS. 5A and 5B are SEM images illustrating planarization effects in the case where 1,2-dichloroethylene (FIGS. 4A and 4B) or 1,2-dichloropropane (FIGS. 5A and 5B) is added to the base gas to bury the step region that is provided on the (100) plane of the InP compound semiconductor crystal and that extends in the direction of <0-11>. FIGS. 4A and 5A show slanted SEM images. FIGS. 4B and 5B show cross-sectional SEM images. The planarization effects can be confirmed after either of the above-mentioned gases is added. The step region is planarized by the InP high resistant buried layers buried on both sides thereof.

Each of 1,2-dichloroethane, 1,2-dichloropropane, and 1,2-dichloroethylene is a chlorinated organic compound including two carbon (C) atoms, and each of the carbon atoms is bonded to one chlorine (Cl) atom in one molecule. By adding the above-mentioned chlorinated organic compound, the crystal growth on the plane (111) A plane can be suppressed and the step region extending in the direction of <0-11> can be buried on a plane. The reasons can be considered as follows.

The inventors have already shown in a non-patent document, Takeuchi et al., "Comparison of chlorocarbons as an additive during MOVPE for flat burying growth of InP", Journal of Crystal Growth (1997) vol. 174, pp. 611 (hereinafter referred to as Document 4) that the chlorinated organic compound including a carbon (C) atom, and each of the carbon atoms is bonded to one chlorine (Cl) atom in one molecule (for instance, chloromethane) has a low decomposition rate in a gas phase, a chemical decomposition is performed with the help of the "catalytic effect" on a substrate plane, after absorbed into the substrate plane. It is thus possible to change a crystal plane orientation dependency (For example, the added chloromethane has an effect that can suppress the crystal growth on the sidewalls of the step region provided on the substrate) and it is effective in controlling the crystal plane while the crystal plane is being grown. In contrast, the chlorinated organic compound including a carbon (C) atom, to which two or more chlorine (Cl) atoms are bonded is readily decomposed in the gas phase, and the crystal plane orientation dependency is slightly affected by the crystal growth rate.

However, there is an advantage of the chlorinated organic compound including a carbon (C) atom to that one chlorine (Cl) atom is bonded, in that low is the decomposition efficiency and high is the crystal plane orientation dependency of the crystal growth. On the other hand, when the amount of addition is increased to a level that considerably lowers the crystal growth rate on the (100) plane or (111) A plane, there arises a problem in that an exhaust system tends to be clogged with polycrystalline etching products piled in a reactor with the increase of the added amount of chloromethane. It was impossible to bury the step region on a plane in the direction of <0-11> with a practical level of the added amount of chloromethane.

In contrast, each of 1,2-dichloroethane, 1,2-dichloropropane, and 1,2-dichloroethylene has a molecular architecture including two chlorine (Cl) atoms in one molecule, and the two chlorine (Cl) atoms are respectively bonded to different carbon (C) atoms. The decomposition efficiency in the gas phase is slightly higher than those of chloromethane and chloroethane (the decomposition efficiencies of these molecules in the gas phase are lower than that of the chlorinated organic compound including a carbon molecule, to which multiple chlorine atoms are bonded). Each of 1,2-dichloroethane, 1,2-dichloropropane, and 1,2-dichloroethylene brings a slightly smaller change in the crystal plane orientation dependency of the crystal growth rate than that of chloromethane. For example, when FIGS. 2B and 2C are compared, suppression effect, not larger than chloromethane, can be found in the crystal growth on the sidewalls of the step region of 1,2-dichloroethane.

That is to say, in the case where the buried layers are made to grow, after adding 1,2-dichloroethane that is the chlorinated organic compound including two carbon (C) atoms, and each of the carbon atoms is bonded to one chlorine (Cl) atom in one molecule, the crystal plane orientation dependency of the crystal growth rate varies moderately. This can reduce the generation of the etching products piled in the reactor, and it is thus possible to decrease the amount of supply to a level that can reduce the crystal growth rate on (100) plane or (111) A plane substantially. The fact that can reduce the crystal growth rate on (100) plane or (111) A plane is an advantage in that the plane is planarized so that the height of the step region may correspond to those of the buried planes on both sides of the step region, regardless of whether the step region extends in the direction of <011> or in the direction of <0-11>.

The chlorinated organic compound including a carbon (C) atom, to which two or more chlorine (Cl) atoms are bonded, has a small crystal growth suppression effect on the sidewalls of the step region extending in the direction of <0-11>. Therefore, in the case where the step region extending in the direction of <0-11> is buried after adding the above-mentioned chlorinated organic compound, (111) A plane is exposed while the buried layers are being buried. An exposed width of (111) A plane becomes larger and the crystal is readily grown on (111) A plane. It is thus hard to bury on a plane.

Each of 1,2-dichloroethane, 1,2-dichloropropane, and 1,2-dichloroethylene is a chlorinated organic compound including two carbon (C) atoms, and each of the carbon atoms is bonded to one chlorine (Cl) atom in one molecule. The above-mentioned planarization effects can be considered to have been caused by adding the chlorinated organic compound including multiple carbon (C) atoms, and each of the carbon atoms is bonded to one chlorine (Cl) atom in one molecule. The same effect is obtainable, if the chlorinated organic compound including one carbon (C) atom to that one chlorine (Cl) atom is bonded in one molecule.

Further, the inventors also found that in the case where the extending direction of the step region in stripes is slightly off from the direction of <0-11> by several degrees, in the burying process of the step region provided on the InP-based (InP, InGaAs, or InGaAsP) compound semiconductor crystal with the InP-based (InP, InGaAs, or InGaAsP) buried layer, it is possible to make the crystal growth (lateral growth) rate extending from the sidewalls of the step region to the lateral direction faster than the lateral growth rate from the step region extending in the direction of <011>. In addition, the inventors also found that the planarization of the step region was achieved with the supply gas to that the chlorinated organic compound is added. Here, the chlorinated organic compound includes, but not limited to, 1,2-dichloroethane, 1,2-dichloropropane, 1,2-dichloroethylene, carbon tetrachloride, monochloroethane, chloromethane, hydrogen chloride, trichloroethane, and the like. The chlorinated organic compound may include chlorine bonded to carbon. The present invention has been made based on the second knowledge.

Figure 6A:
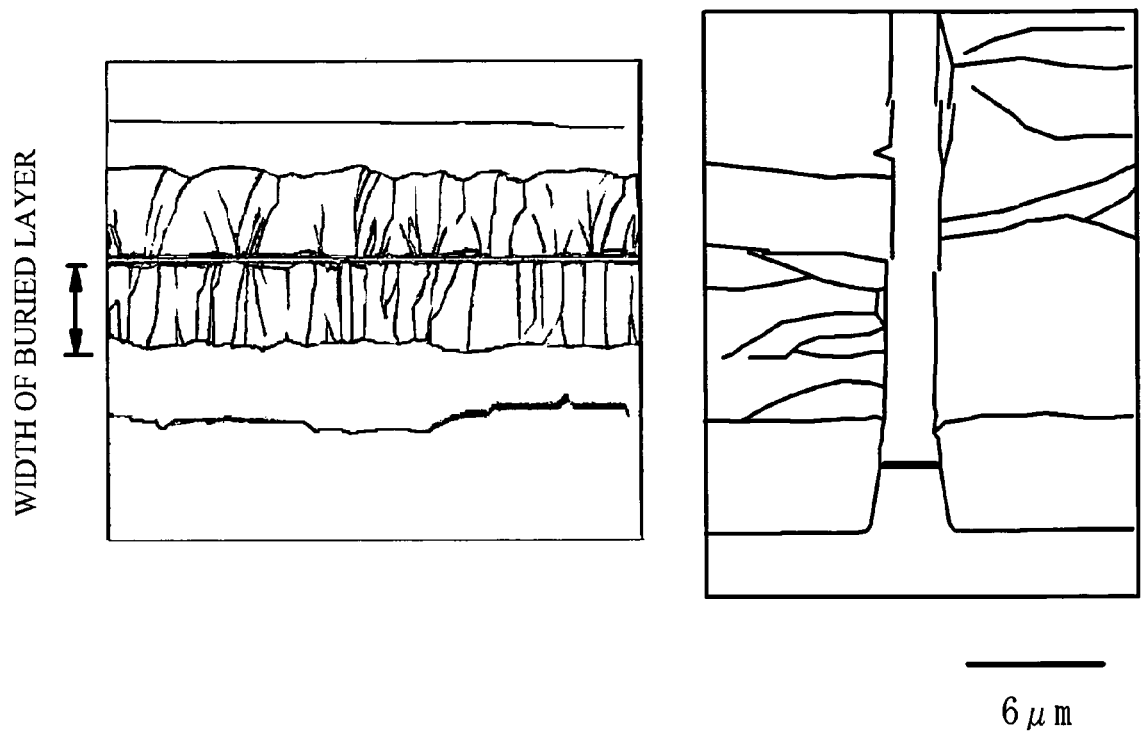
FIG. 6A shows a case where an off angle is 0 (exactly the [0-11] direction)
Figure 6B:
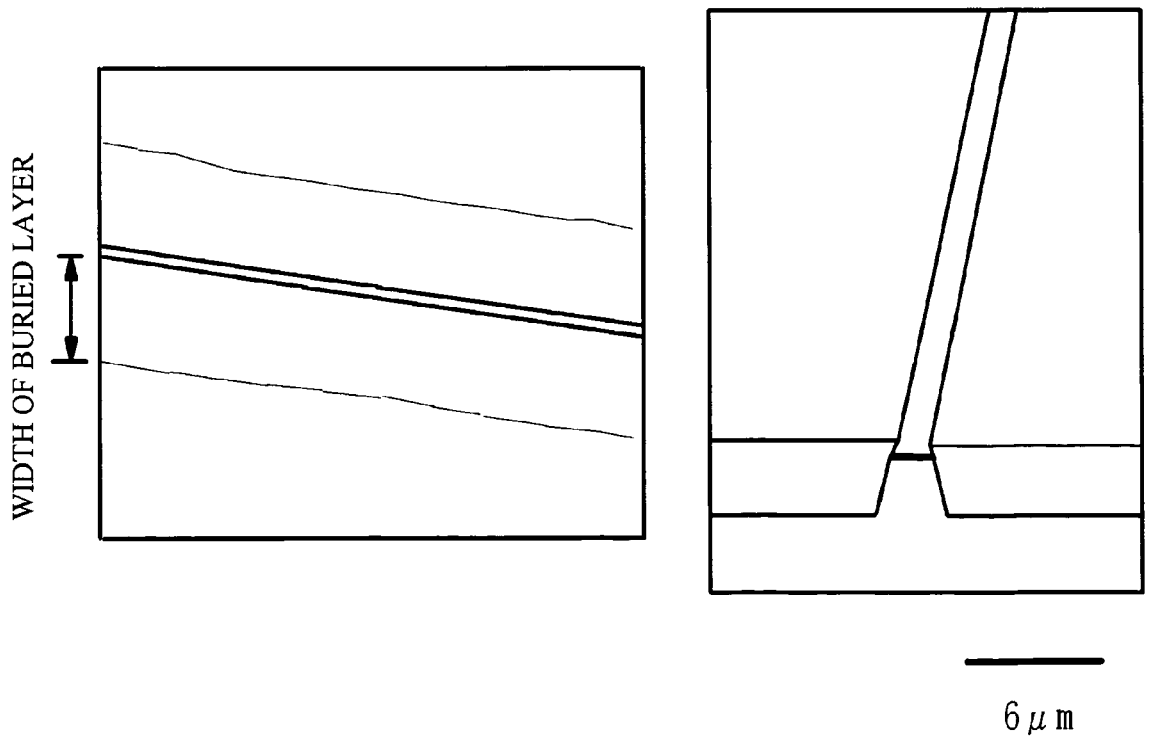
FIG. 6B shows a case where 6.5 degrees are off.

Document 2 describes that in the case where the off angle from the direction of <0-11> when the step region extends is less than five degrees, a protrusion of 1 μm or more is generated on the sidewall of the step region, and the plane is not planarized. However, according to the studies of the inventors, it was found that even in the case where several degrees are off from an extending direction of <0-11> of the step region, and the lateral growth rate becomes faster and the time required for the growth in the buried layers become shorter. Even if the MOCVD growth is conducted with the base gas in which the conventionally used chlorinated organic compound such as chloromethane or chloroethane, without limiting to 1,2-dichloroethane, is added, the inventors found that the defect generated in the laminated layer can be suppressed and a plane buried shape is obtainable FIGS. 6A and 6B show the planarization effects in the case where the extending direction of the step region is slightly off from the direction of <0-11>, in the step region of the InP compound semiconductor crystal (100) plane. FIG. 6A shows a case where the off angle is 0 (exactly the [0-11] direction). FIG. 6B shows a case where 6.5 degrees are off. In FIGS. 6A and 6B, left images are taken with Nomarski microscope, and right images are taken with a SEM. The right images of FIGS. 6A and 6B are cross-sectional views of the planes.

Conditions of the MOCVD growth of the InP buried layers are as follows. The substrate temperature is 560 to 600° C. The growth pressure is 100 to 760 Torr. The gas flow rate of the chlorinated organic compound is set to six times or more that of TMI gas for supplying In. The above-mentioned conditions have a low growth temperature and high pressure, as compared to the general conditions of the MOCVD growth. The burying conditions in FIGS. 6A and 6B include that the substrate temperature is 575° C., the pressure is 150 Torr, and the added chlorinated organic compound is $CH_3Cl$. (5.0 ccm, $CH_3Cl/TMI=15$)

In the case where the off angle is 0 degree as shown in FIG. 6A, the InP buried layers extending on the both sides of the step region has uneven planes. In the case where the off angle is 6.5 degrees as shown in FIG. 6B, it can be seen readily that the InP buried layers extending on the both sides of the step region have plane surfaces. When comparing the widths of the both sides of the buried layers, which show the lateral growth from the sidewalls of the step region, the case of 6.5 degrees off (shown in the left image of FIG. 6B) is an approximately 20 percent larger than the case of the exact direction of [0-11] (shown in the left image of FIG. 6A). Thus, the lateral growth is accelerated when the extending direction of the step region is off from the direction of <0-11> by several degrees.

It is thus possible to obtain the buried shape having a sufficient planarization, by making the extending direction of the step region become off from the direction of <0-11> by several degrees. This can be achieved by adding the chlorinated organic compound, such as chloromethane, which is a chlorinated organic compound and generally used for the MOCVD growth. The added chlorinated organic compound is not limited to 1,2-dichloroethane only. Also, the inventors found from the experiment results that 2.5 degrees of the off angle is also effective for the planarization.

In the case where the buried region is buried for planarization in the extending direction of the exact <0-11> direction or off from the direction of <0-11> by several degrees, any chlorinated organic compound generates a gap between the step region and the buried layers of the both sides of the step region. The buried layers of the both sides of the step region are higher than the step region, if the both sides of the step region are formed widely (for example, if the high resistant buried layers under the electrode pad are made thicker to reduce the element capacity). Therefore, the above-mentioned gap is required to be avoided depending on the device structure to be produced, for example in the case where the device uses an electrode material requiring planarization or an n-type block layer is provided closely to the step region after the high resistant buried layers are grown such as the laser diode having an SIPBH (Semi Insulating Planar Buried Hetero) structure. In these cases, it is possible to make the height of the step region equal to those of the buried layers by etching the planes of the buried layers to remove an unnecessary thickness corresponding to the gap.

Figure 7A:
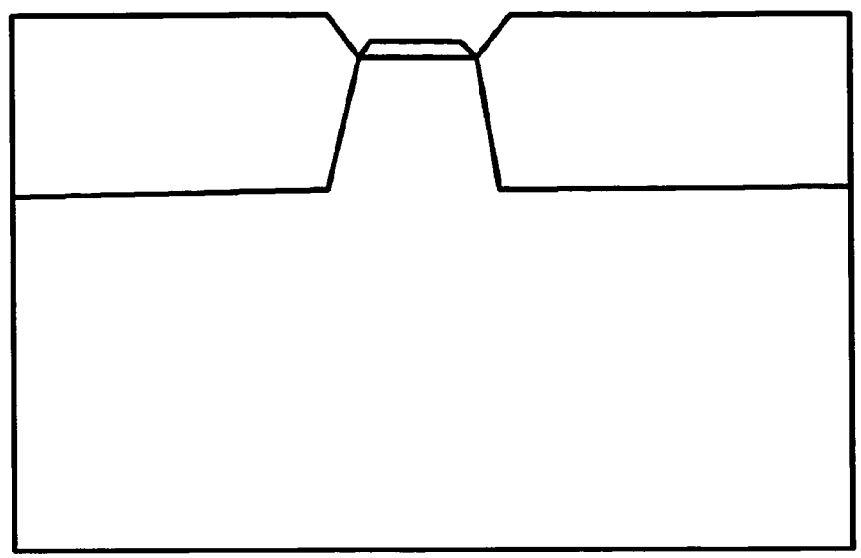
FIG. 7A is a cross-sectional SEM image before etching.
Figure 7B:
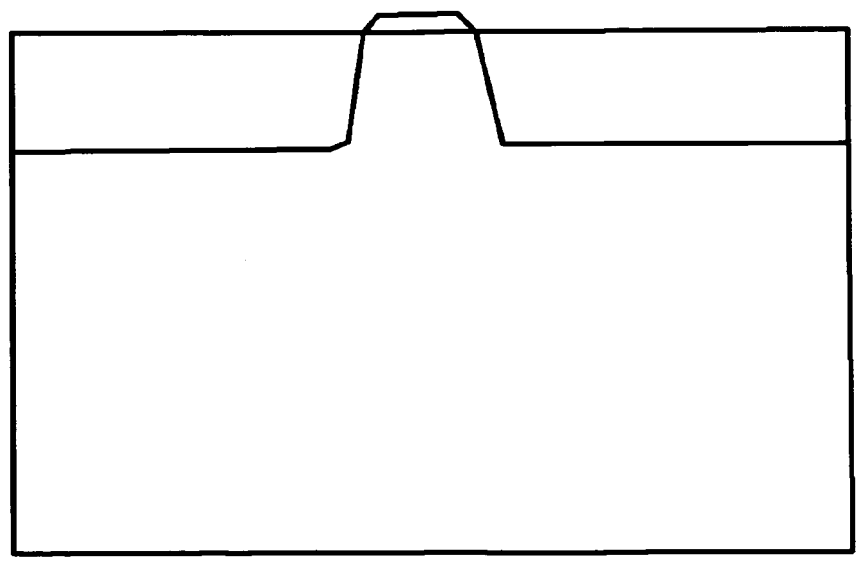
FIG. 7B is a cross-sectional SEM image after etching.

FIGS. 7A and 7B show before and after etching the InP buried layers. FIG. 7A is a cross-sectional SEM image before etching. FIG. 7B is a cross-sectional SEM image after etching. Thin films seen on the plane (100) in these SEM images are layers used as masks (mask layer) when the crystal of the InP buried layers is grown.

Referring to FIG. 7A, the InP buried layers, which has been grown with 1,2-dichloroethylene, are thicker than the step region. The planes of the InP buried layers on both sides of the step region extending in the exact direction [0-11] are higher than that of the step region. The facet plane of (111) A plane (In plane) appears between the plane of the InP buried layers (100) and the (100) plane of the step region.

In the above-mentioned state, the InP buried layers are etched for five minutes with an wet etchant (hydrochloric acid : acetic acid : hydrogen peroxide solution:water=1:1:1:1). Referring to FIG. 7B, the thickness corresponding to the gap between the (100) plane of the step region and the (100) planes of the InP buried layers is removed so that the height of step region may be equal to that of the InP buried layers.

(111) A plane cannot be etched with the normal wet etching. Even if the whole InP buried layers are etched by the above-mentioned etching conditions, the facet shape of (111) A plane can be kept in the etching process, and it is thus possible to planarize the buried layers. This is different from the case where the planarization cannot be achieved by wet etching the whole InP buried layers, since (111) B plane (P plane) is removed by the normal wet etching. (111) B plane is generated between the step region and buried layer, when burying the step region extending in the direction of <011>.

The description has been given of the heights are made equal by wet etching. The etching method is not limited to wet etching. The gas etching may be performed in the reactor after supplying Cl to the MOCVD reactor, and the dry etching such as RIE may be performed.

A description will now be given of embodiments of the present invention in detail.

First Embodiment

A first embodiment of the present invention relates to the invention based on the first knowledge as described above.

Figure 8:
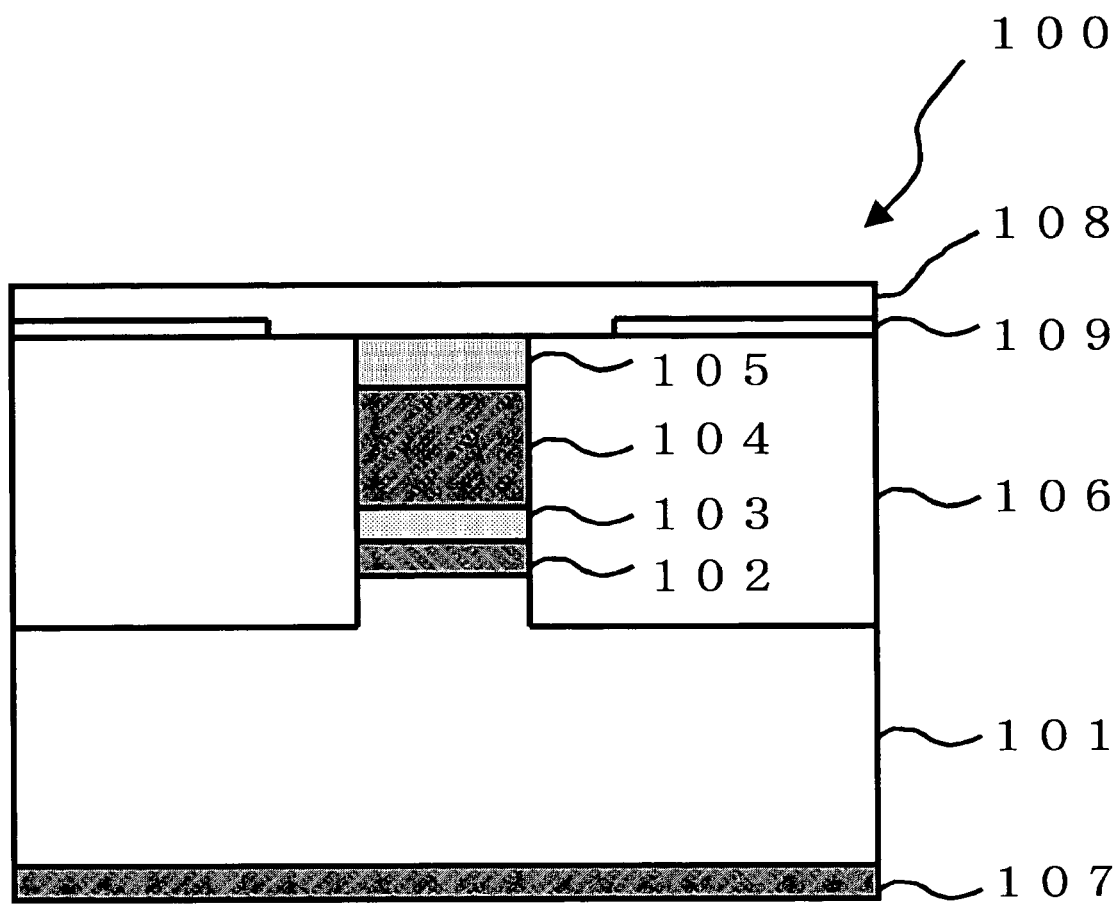
FIG. 8 is an example of the laser diode of the SIBH structure in accordance with the first embodiment of the present invention and is a cross-sectional view of the laser diode from the direction of [0-11]
Figure 8:

FIG. 8 is an example of the laser diode of the SIBH (Semi Insulating Buries Hetero) structure in accordance with the first embodiment of the present invention and is a cross-sectional view of the laser diode from the direction of [0-11]. A laser diode 100 includes an n-type (100) InP substrate 101. The n-type (100) InP substrate 101 has an n-side electrode 107 on the backside and the step region on the main surface. The step region extends in the direction of [0-11] in stripes and includes an n-type InGaAsP guide layer 102, an InGaAsP-MQW active layer 103, a p-type InP clad layer 104, and a p-type InGaAs contact layer 105, which are sequentially deposited. The step region is planarized by an Fe-doped high resistant buried layers 106. An $SiO_2$ protective film 109 is provided in the step region with an opening so as to expose the whole plane of the p-type InGaAs contact layer 105 and part of the Fe-doped high resistant buried layers 106. The p-side electrode 108 is provided to bias the p-type InGaAs contact layer 105 in the opening of the $SiO_2$ protective film 109. The Fe-doped high resistant buried layers 106, in which Fe is doped to be semi-insulating and high resistant, is provided for avoiding the leakage current form a light-emitting region.

Figure 9A:
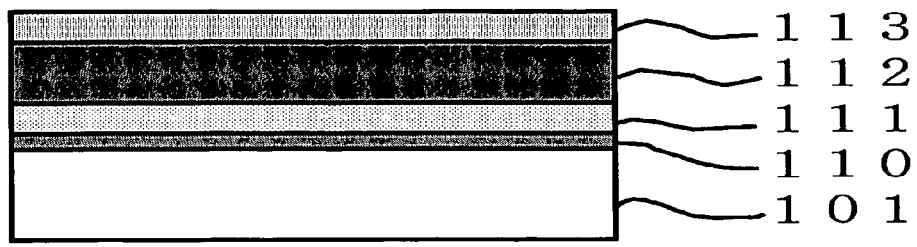
FIGS. 9A through 9E illustrate burying processes of the production of the laser diode with an $SiO_2$ selective growth mask.
Figure 9B:
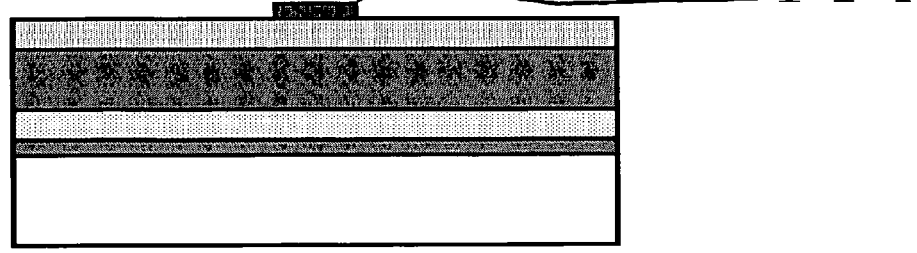

Referring to FIGS. 9A through 9E, a description will be given of the production process of the laser diode shown in FIG. 8. First, an n-type InGaAsP layer 110, an InGaAsP layer 111, a p-type InP layer 112, and a p-type InGaAs layer 113 are sequentially deposited on the main plane of the n-type (100) InP substrate 101 by MOCVD method as shown in FIG. 9A. Next, a $SiO_2$ selective growth mask 114 is formed on one region of the p-type InGaAs layer 113. The $SiO_2$ selective growth mask 114 extends in the direction of [0-11] by the width of 2.5 µm, with the chemical vapor deposition (CVD), optical lithography, and the HF-based wet etching technique.

Figure 9C:
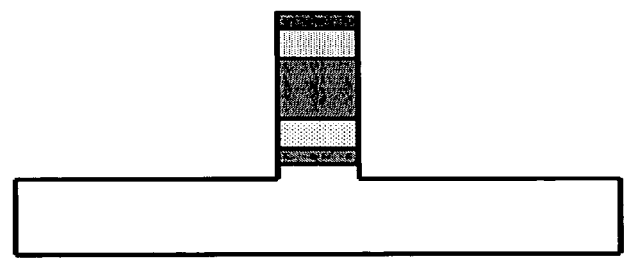
Figure 9D:
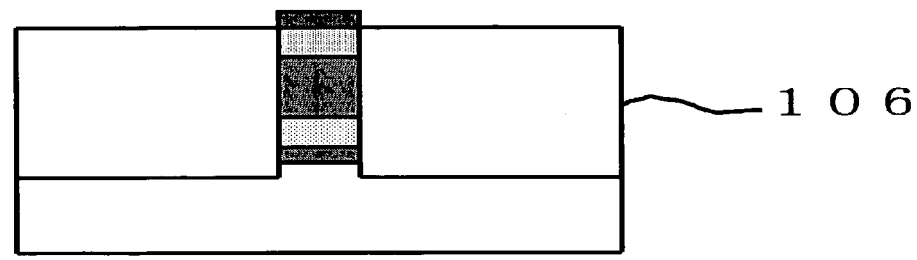
Figure 9E:
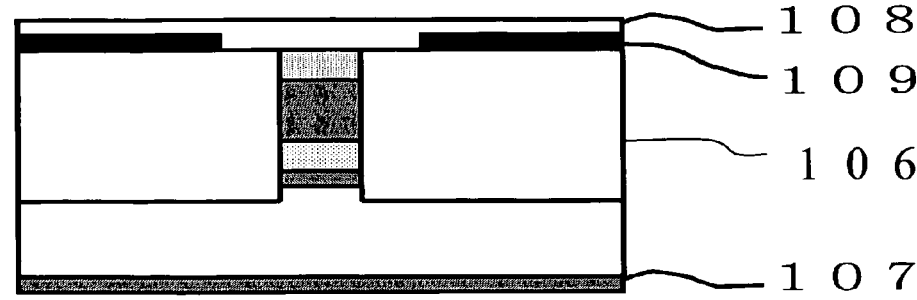

In this state, the etching is performed with the RIE method using a mixed gas of ethane, hydrogen, and oxygen to remove the region that is not masked with the $SiO_2$ selective growth mask 114. After this etching, the step region of the mesa shape is formed to the depth of 3.0 µm from the main plane of the n-type (100) InP substrate 101. The mesa shape has the virtually vertical sidewalls (as shown in FIG. 9C).

After the step region is thus formed, 1,2-dichloroethane gas (flow rate is 6 ccm) used for adding the chlorinated organic compound is added to the base gas in which TMI for supplying In (flow rate is 0.35 ccm), $PH_3$ for supplying P (flow rate is 100 ccm), and ferrocene for supplying Fe dopant (flow rate is $5.0 \times 10^{-4}$ ccm) are mixed. The Fe-doped high resistant buried layers 106 are made to grow with the MOCVD method (electric resistivity $1 \times 10^9$ Ω·cm) to be substantially equal to that of the plane of the step region (shown in FIG. 9D). The conditions of the MOCVD growth are as follows. The substrate temperature is 590° C. The growth pressure is 150 Torr. The crystal growth rate is 1.0 µm/h. It takes 40 minutes for the growth period to obtain a plane surface having 10 µm on one side in the lateral direction from one of the sidewalls of the step region. After the Fe-doped high resistant buried layers 106 are grown, the remaining $SiO_2$ selective growth mask 114 is removed. The $SiO_2$ protective film 109 is provided in the step region with an opening so as to expose the whole plane of the p-type InGaAs contact layer 105 and part of the Fe-doped high resistant buried layers 106. The p-side electrode 108 of Ti/Pt/Au laminated film is formed by sputtering to form a film in the opening of the SiO$_2$ protective film 109 and keep in contact with the p-type InGaAs contact layer 105. The n-side electrode 107 formed by the AuGe/Au laminated film is formed by sputtering to form a film on the backside of the n-type (100) InP substrate (shown in FIG. 9E). The laser diode shown in FIG. 8 is thus obtainable.

In the case where the surface of the step region is approximately 10 μm on one side in the lateral direction, the height of the surface of the step region is equal to those of the buried layers. Thus, any additional etching is unnecessary for making the heights equal. However, in the case where the plane surface of the step region is approximately 20 μm on one side, the surfaces of the buried layers are unavoidably higher than that of the step region. Therefore, etching removes approximately 0.10 μm of the vicinity of the surfaces in the buried layers for planarization.

Figure 10A:
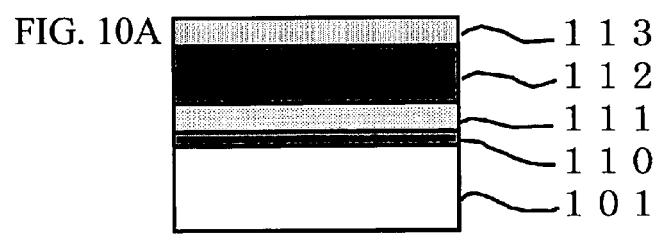
FIGS. 10A through 10G illustrate the burying processes of the production of the laser diode without the $SiO_2$ selective growth mask.
Figure 10B:
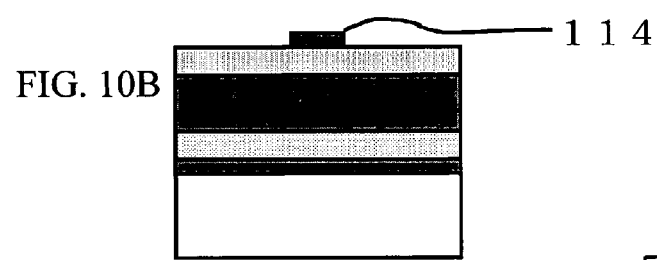
Figure 10C:
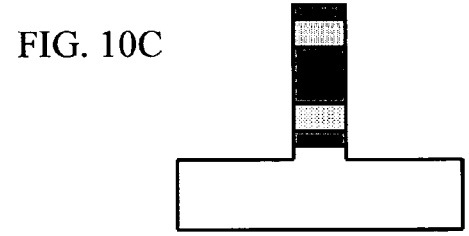

FIGS. 10A through 10G illustrate the burying processes of the production of the laser diode shown in FIG. 8, without the SiO$_2$ selective growth mask 114. The processes shown in FIGS. 10A through 10C are same as those of FIGS. 9A through 9C.

Figure 10F:
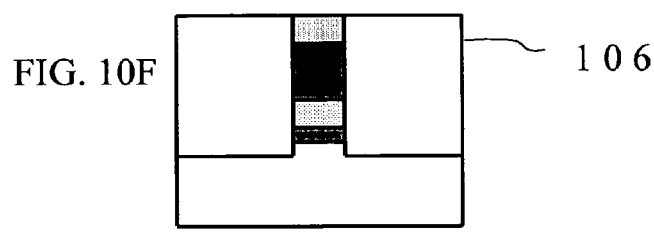
Figure 10D:
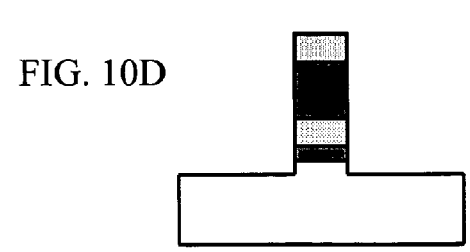
Figure 10G:
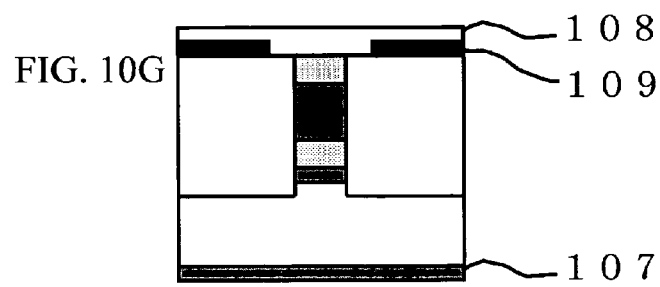
Figure 10E:
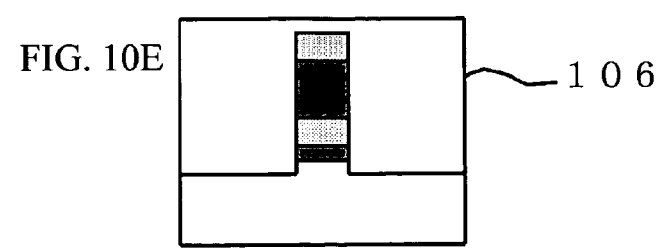

After the step region is formed as shown in FIG. 10C and the SiO$_2$ selective growth mask 114 is removed as shown in FIG. 10D. 1,2-dichloroethane gas (flow rate is 6 ccm) used for adding the chlorinated organic compound is added to the base gas in which TMI for supplying In (flow rate is 0.35 ccm), PH$_3$ for supplying P (flow rate is 100 ccm), and ferrocene for supplying Fe dopant (flow rate is $5.0 \times 10^{-4}$ ccm) are mixed. The Fe-doped high resistant buried layers 106 are made to grow with the MOCVD method (electric resistivity $1 \times 10^9$ Ω·cm) to the whole surface to cover the surface of the step region as shown in FIG. 10E.

Next, etching is performed so that the height of the surface in the step region may be equal to that of the Fe-doped buried layers 106 (shown in FIG. 10F). The SiO$_2$ protective film 109 is provided with an opening so as to expose the whole surface of the p-type InGaAs contact layer 105 and part of the Fe-doped high resistant buried layers 106. The p-side electrode 108 of Ti/Pt/Au laminated film is formed by sputtering to form a film in the opening of the SiO$_2$ protective film 109 and keep in contact with the p-type InGaAs contact layer 105. The n-side electrode 107 formed by the AuGe/Au laminated film is formed by sputtering to form a film on the backside of the n-type (100) InP substrate (shown in FIG. 9E). The laser diode shown in FIG. 8 is thus obtainable without the SiO$_2$ selective growth mask.

The gas to be added to the base gas may not be necessarily 1,2-dichloroethane. 1,2-dichloropropane and 1,2-dichloroethylene may be added as described above.

With respect to the MOCVD growth of the high resistant buried layers to bury the step region extending in the direction of <0-11> in stripes, it is possible to bury the buried layers with a sufficient planarization for a short period of time, by adding any one of 1,2-dichloroethane, 1,2-dichloropropane, and 1,2-dichloroethylene to the base gas.

In accordance with the first embodiment of the present invention, it is possible to bury the step region having the sidewall in a desirable direction from the direction of <0-11> to <011>, in the step region provided on the InP-based (InP, InGaAs, and InGaAsP) compound semiconductor crystal plane (100). In addition, it is also possible to configure to satisfy the growth conditions of the InP-based (InP, InGaAs, and InGaAsP) buried layers so as to bury the step region extending the growth conditions of the InP-based (InP, InGaAs, and InGaAsP) buried layers in the direction of [011] on a plane. Therefore, it is possible to apply the fabricating method of the optical semiconductor device in accordance with the first embodiment of the present invention to a burying process of a device having the optical function that has the step regions in the direction of [0-11] and in the direction of [011] on the same substrate. As described, the InP-based (InP, InGaAs, and InGaAsP) buried layers are grown with the MOCVD method after adding any one of 1,2-dichloroethane, 1,2-dichloropropane, and 1,2-dichloroethylene is added, in accordance with the first embodiment of the present invention.

Second Embodiment

A second embodiment of the present invention relates to a method of making the height of the step region (100) plane equal to that of the buried layer (100) plane.

Figure 11A:
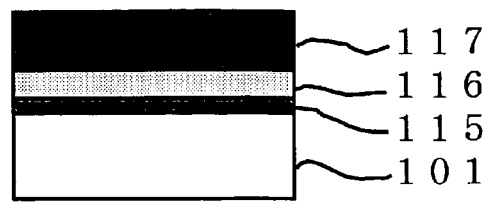
FIGS. 11A through 11H illustrate fabricating processes of the laser diode having an SIPBH structure in accordance with a second embodiment of the present invention.
Figure 11B:
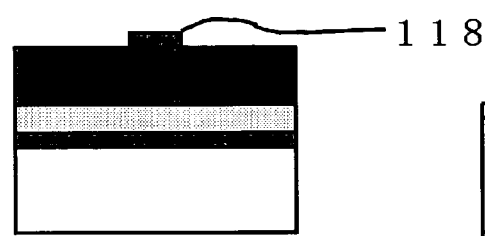

Referring to FIGS. 11A through 11H, a description will be given of the fabricating processes of the laser diode having the SIPBH structure. First, an n-type InGaAsP layer 115, an InGaAsP layer 116, and a p-type InP layer 117 are sequentially deposited on the main surface of the n-type (100) InP substrate 101 as shown in FIG. 11A. Next, a SiO$_2$ selective growth mask 118 is formed in one region of the p-type InP layer 117, with the CVD method, the optical lithography, and HF-based wet etching technique. The SiO$_2$ selective growth mask 118 has a thickness of 0.3 μm and is extending in the direction of [0-11] with the width of 2.5 μm as shown in FIG. 11B.

In this state, the etching is performed with the RIE method using a mixed gas of ethane, hydrogen, and oxygen to remove the region that is not masked with the SiO$_2$ selective growth mask 118. After this etching, the step region of the mesa shape is formed to the depth of 2.0 μm from the main plane of the n-type (100) InP substrate 101. The mesa shape has the virtually vertical sidewalls (as shown in FIG. 11C).

After the step region is thus formed, 1,2-dichloroethane gas (flow rate is 6 ccm) used for adding the chlorinated organic compound is added to the base gas in which TMI for supplying In (flow rate is 0.35 ccm), PH$_3$ for supplying P (flow rate is 100 ccm), and ferrocene for supplying Fe dopant (flow rate is $5.0 \times 10^{-4}$ ccm) are mixed. The Fe-doped high resistant buried layer 122a is made to grow with the MOCVD method (electric resistivity $1 \times 10^9$ Ω·cm) shown in FIG. 11D. The conditions in the MOCVD growth are as follows. The substrate temperature is 590° C. The growth pressure is 150 Torr. The crystal growth rate is 1.0 μm/h. It takes 40 minutes for the growth. The surface of the (100) plane is higher than that of the p-type InP layer 117 by 0.20 μm and has a gap. The surface of the (100) plane is an edge of the SiO$_2$ selective growth mask 118 in a buried layer 122a. The surface of the p-type InP layer 117 corresponds to the surface of the (100) plane of the step region.

Figure 11F:
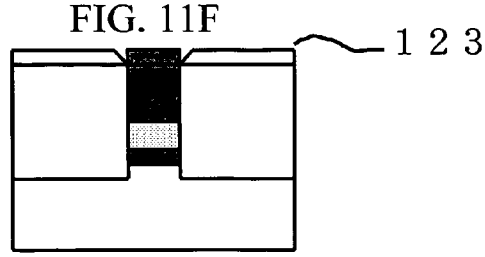
Figure 11C:
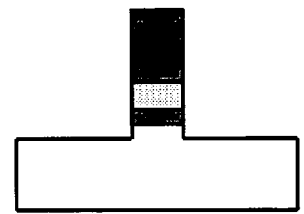
Figure 11G:
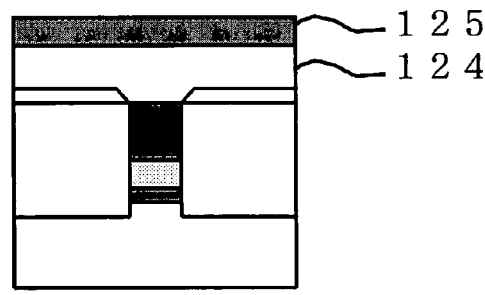
Figure 11D:
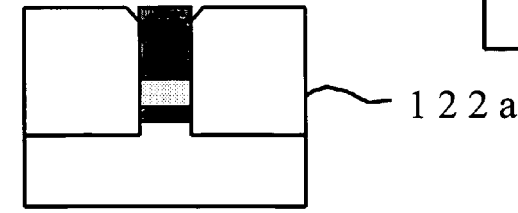
Figure 11E:
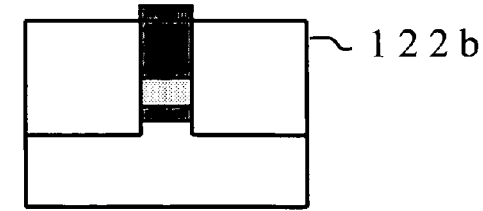

Therefore, the buried layer 122a is etched for two minutes with the wet etchant (hydrochloric acid:acetic acid:hydrogen peroxide solution:water=1:1:1:1) to remove the above-mentioned gap of 0.2 μm for planarize a buried layer 122b (as shown in FIG. 11E).

An InP current block layer 123 (donor density is $1.8 \times 10^{19}$ cm$^{-3}$) having a thickness of 0.25 μm is grown on the buried layer 122b that has been planarized as described, with the MOCVD method (as shown in FIG. 11F). 1,2-dichloroethane gas (flow rate is 6 ccm) used for adding the chlorinated organic compound is added to the base gas in which TMI for supplying In (flow rate is 0.35 ccm), PH$_3$ for supplying P (flow rate is 100 ccm), and H$_2$S for supplying S dopant (flow rate is 0.10 ccm) are mixed. The substrate temperature is 590° C. The growth pressure is 150 Torr.

Then, a p-type InP clad layer 124 (acceptor density is $1.8 \times 10^{18}$ cm$^{-3}$) having a thickness of 1.5 μm and a p-type InGaAs contact layer 125 (acceptor density is $1.8 \times 10^{19}$ cm$^{-3}$) having a thickness of 0.5 μm are sequentially deposited on the whole main surface of the laminated body (shown in FIG. 11G). Here, supplied gases are TMI, TEG, PH$_3$, AsH$_3$ and DMZn for the p dopant. The substrate temperature is 600° C. The growth pressure is 76 Torr.

Figure 11H:
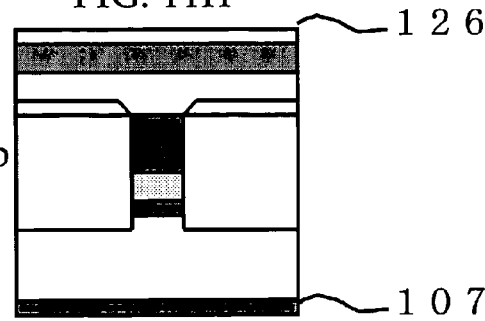

Finally, a p-side electrode 126 of Ti/Pt/Au laminated film is formed by sputtering to form a film on the p-type InGaAs contact layer, and the n-side electrode 107 formed by the AuGe/Au laminated film is formed by sputtering to form a film on the backside of the InP substrate 101 (as shown in FIG. 11H).

With the above-mentioned processes, it is possible to bury the step region extending in the direction of [0-11] in stripes with the high resistant buried layers to make the heights of the buried layers and those of the buried layers equal. It is thus possible to arrange the n-type InP current block layer close to the step region with an excellent control.

A description has been given of the laser diode as an example of the optical semiconductor device to which the present invention can be applied. In addition, the present invention is applicable to other optical semiconductor devices such as an optical modulator, a photodetector, and the like. For instance, in the optical modulator, after an active layer of a light guide is formed, the step region provided on both sides of the active layer is buried in accordance with the present invention. In the photodetector, the buried layer is formed from an upper part to a lower part in the step region provided on both sides of a light incidence plane (receiving plane) in accordance with the present invention.

It is possible to bury the step region extending in the direction of <0-11> on the InP-based (InP, InGaAs, and InGaAsP) compound semiconductor crystal (100) plane, with the InP-based (InP, InGaAs, and InGaAsP) buried layers for planarization, in accordance of the present invention. It is thus possible to improve the design flexibility of the device structure of the optical semiconductor devices such as the laser diode and the like and the flexibility of the fabricating processes and to lower the cost.

The present invention is not limited to the above-mentioned embodiments, and other embodiments, variations and modifications may be made without departing from the scope of the present invention.

The present invention is based on Japanese Patent Application No. 2004-0032753 filed on Feb. 9, 2004, the entire disclosure of which is hereby incorporated by reference.

What is claimed is:

1. A method of fabricating a semiconductor device comprising the steps of:
   forming a step region having a mesa shape in a direction of <011> or <0-11> on a (100) plane of an InP-based compound semiconductor crystal; and
   burying the step region with InP-based buried layers grown by vapor-phase growth by supplying a base gas to which a chlorinated organic compound is added, the chlorinated organic compound including at least two carbon atoms, in one molecule, each of the carbon atoms being bonded to one chlorine atom.

2. The method as claimed in claim 1, wherein the chlorinated organic compound includes only two carbon atoms.

3. The method as claimed in claim 1, wherein the chlorinated organic compound is any one of 1,2-dichloroethane, 1,2-dichloropropane, and 1,2-dichloroethylene.

4. The method as claimed in claim 1, wherein the compound semiconductor crystal is one selected from a group consisting of InP, InGaP, and InGaAsP.

5. The method as claimed in claim 1, wherein the buried layers are compound semiconductor crystals of one selected from a group consisting of InP, InGaP, and InGaAsP.

6. The method as claimed in claim 1, wherein the step of forming the InP-based buried layers employs MOCVD in which:
   a substrate temperature ranges from 560 to 600° C.;
   a growth pressure ranges from 100 to 760 Torr; and
   a gas flow rate of the chlorinated organic compound is set to at least six times the gas flow rate of trimethylindium (TMI) for supplying In.

7. The method as claimed in claim 1, wherein the step region has a shape of a stripe, a cylinder, and a rectangle.

8. The method as claimed in claim 1, wherein the buried layers cover a top plane of the step region.

9. The method as claimed in claim 1, wherein etching the buried layers so as to have a height approximately equal to that of the step region.

10. The method as claimed as claim 9, wherein the step of etching employs dry etching with a gas including chlorine or wet etching with a mixed liquid where hydrochloric acid: acetic acid hydrogen peroxide solution:water=1:1:1:1.

11. The method as claimed as claim 1, wherein the step region is provided on both sides of an active layer of one of a laser diode and an optical modulator or both sides of a light incidence plane of a photodetector.

12. The method as claimed as claim 1, further comprising a step of providing a mask layer on a top plane of the step region to suppress growth of the buried layers, wherein the buried layers are formed as high as the step region.

* * * * *